(12) United States Patent
Fan et al.

(10) Patent No.: US 6,607,957 B1
(45) Date of Patent: Aug. 19, 2003

(54) METHOD FOR FABRICATING NITRIDE READ ONLY MEMORY

(75) Inventors: Tso-Hung Fan, Taipei Hsien (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,614

(22) Filed: Jul. 31, 2002

(51) Int. Cl.$^7$ .......................................... H01L 21/8246
(52) U.S. Cl. ...................... 438/276; 438/287; 438/301; 438/530; 438/532; 438/564
(58) Field of Search ................. 438/276, 287, 438/301, 530, 532, 564, 660, 920, FOR 212, FOR 322

(56) References Cited

U.S. PATENT DOCUMENTS

| | | | |
|---|---|---|---|
| 5,279,981 A | * | 1/1994 | Fukatsu et al. ............. 438/264 |
| 5,597,751 A | * | 1/1997 | Wang ......................... 438/261 |
| 6,103,580 A | * | 8/2000 | Guo ........................... 438/291 |
| 6,165,825 A | * | 12/2000 | Odake ......................... 438/217 |
| 6,255,214 B1 | * | 7/2001 | Wieczorek et al. .......... 438/659 |
| 6,287,967 B1 | * | 9/2001 | Hsieh et al. ................ 438/664 |
| 6,306,712 B1 | * | 10/2001 | Rodder et al. .............. 438/289 |
| 6,383,906 B1 | * | 5/2002 | Wieczorek et al. .......... 438/592 |
| 2001/0016389 A1 | * | 8/2001 | Wang et al. ................ 438/276 |
| 2001/0026968 A1 | * | 10/2001 | Sung et al. ................ 438/200 |
| 2002/0094676 A1 | * | 7/2002 | Huang et al. ............... 438/655 |
| 2003/0013242 A1 | * | 1/2003 | Lai et al. .................... 438/197 |
| 2003/0036233 A1 | * | 2/2003 | Chen ........................... 438/261 |

* cited by examiner

Primary Examiner—George Fourson
Assistant Examiner—Joannie Adelle Garcia
(74) Attorney, Agent, or Firm—Jianq Chyun IP Office

(57) ABSTRACT

The present invention relates to a method for fabricating a nitride read only memory (NROM), comprising: forming a doped polysilicon layer over a substrate, defining the doped polysilicon layer by using a patterned mask layer to form a plurality of doped polysilicon lines and expose a portion of the substrate. Afterwards, a thermal process is performed to form an oxide layer on the exposed substrate and sidewalls of the doped polysilicon lines. During the thermal process, the dopants are driven into the substrate to form a source/drain region, thus obtaining a plurality of bit lines including the doped polysilicon lines and the source/drain region. Following removal of the patterned mask layer, a self-aligned silicide layer is formed on the top surface of the bit lines. After removing the oxide layer, a silicon nitride stacked layer and a plurality of word lines are formed over the substrate.

18 Claims, 3 Drawing Sheets

METHOD FOR FABRICATING NITRIDE READ ONLY MEMORY

CROSS REFERENCE TO RELATED APPLICATIONS

This application claims the priority benefit of Taiwan application serial no. 91115991, filed Jul. 18, 2002.

BACKGROUND OF INVENTION

1. Field of Invention

The present invention relates to a method for fabricating a read only memory (ROM). More particularly, the present invention relates to a method for fabricating a nitride ROM.

2. Description of Related Art

The manufacture process for forming non-volatile read only memory (ROM) includes forming a trapping layer over the substrate. If the trapping layer consists of a stacked structure made of a silicon oxide/silicon nitride/silicon oxide (ONO) composite layer, the ROM is called nitride ROM. The polysilicon gate is formed on the ONO layer as a word line. Afterwards, a source/drain region is formed in the substrate on both sides of the ONO layer, as a buried bit line.

As the memory device keeps minimizing, the length of the gate shrinks down. The buried bit line formed by ion implantation can easily have dopant diffusion during the thermal treatment, thus reducing the effective channel length of the device. To overcome the prior problems, shallow junctions (or ultra shallow junctions) together with pocket implant are used in developing devices of smaller sizes. However, the buried bit line consisting of shallow junction or ultra shallow junction usually has high resistance, so that the memory devices have difficulties in operation.

SUMMARY OF INVENTION

The invention provides a method for fabricating a nitride read only memory (NROM), which can decrease the resistance of the bit line.

The invention provides a method for fabricating a nitride read only memory (NROM), which can increase conductivity of the bit line.

The invention provides a method for fabricating a nitride read only memory (NROM), which can prevent the short channel effect resulting from dopant diffusion of the buried bit line during the thermal treatment.

As embodied and broadly described herein, the present invention provides a method for fabricating a nitride read only memory (NROM), comprising: forming a doped polysilicon layer over a substrate, forming a patterned mask layer on the doped polysilicon layer, defining the doped polysilicon layer to form a plurality of doped polysilicon lines and expose a portion of the substrate. Afterwards, a thermal process is performed to form an oxide layer on the exposed substrate and sidewalls of the doped polysilicon lines. During the thermal process, the dopants are driven into the substrate to form a source/drain region, thus obtaining a plurality of bit lines including the doped polysilicon lines and the source/drain region. Later on, the patterned mask layer is removed to expose a top surface of the bit lines. A self-aligned silicide process is performed to form a self-aligned silicide layer on the top surface of the bit lines. After removing the oxide layer, a silicon nitride stacked layer and a plurality of word lines are formed over the substrate.

Because the source/drain region formed under the doped polysilicon lines through the thermal treatment is used as the buried bit line, the present invention can greatly decrease the resistance of the bit line. The present invention can avoid short channel effect, since no dopant diffusion of the buried bit line occurs in the thermal process. In addition to the polysilicon lines and the source/drain region, the bit line further includes a self-aligned silicide layer on the top surface of the polysilicon lines, thus increasing conductivity of the bit line.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention provides a method for manufacturing nitride read only memory (NROM), which can prevent the high resistance problem resulting from shallow junction in NROM.

FIG. 1A to FIG. 1F are cross-sectional views of the manufacture processes for forming NROM according to one preferred embodiment of the present invention.

Figure 1A:
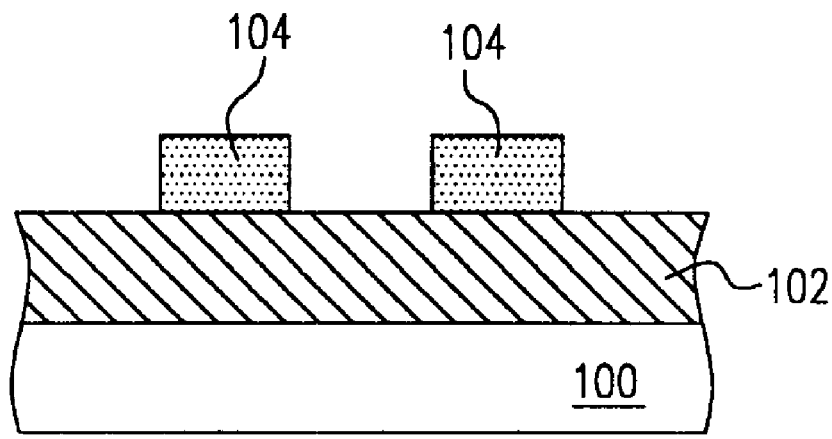
FIG. 1A to FIG. 1F are cross-sectional views of the manufacture processes for forming NROM according to one preferred embodiment of the present invention.

Referring to FIG. 1A, a doped polysilicon layer 102 is formed over a provide substrate 100. A patterned mask layer 104 is formed on the doped polysilicon layer 102. For example, the patterned mask layer 104 is a silicon nitride layer.

Figure 1B:
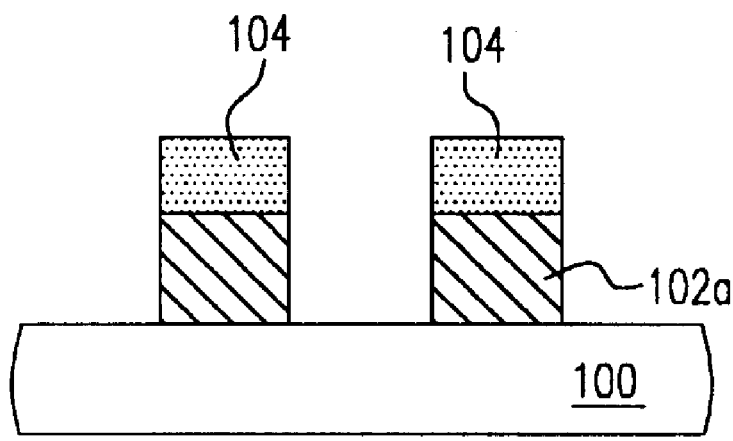

As shown in FIG. 1B, using the patterned mask layer 104 as a mask to define the doped polysilicon layer 102, a plurality of doped polysilicon lines 102a are formed and a portion of the substrate 100 is exposed.

Figure 1C:
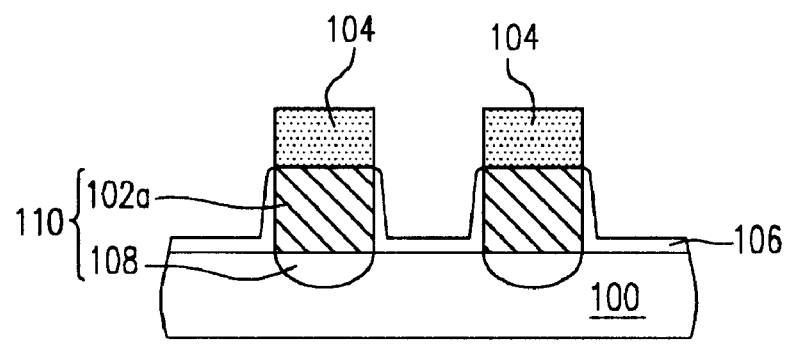

Referring to FIG. 1C, a thermal treatment, such as, a thermal oxidation process, is performed, so that an oxide layer 106 is formed on the exposed substrate 100 and sidewalls of the doped polysilicon lines 102a. During the thermal treatment, dopants in the doped polysilicon lines 102a diffuse into the substrate 100 to form a source/drain region 108. The doped polysilicon line 102a and the source/drain region 108 make up a bit line 110.

Figure 1D:
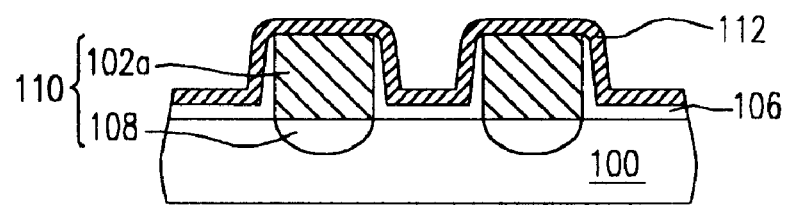

Referring to FIG. 1D, the patterned mask layer 104 is removed to expose the top surface of the bit line 110. Afterwards, a metal layer 112 is formed over the substrate 100 to cover the bit line 110. For example, the metal layer 112 is a cobalt/titanium (Co/Ti) layer or a tungsten (W) layer.

Figure 1E:
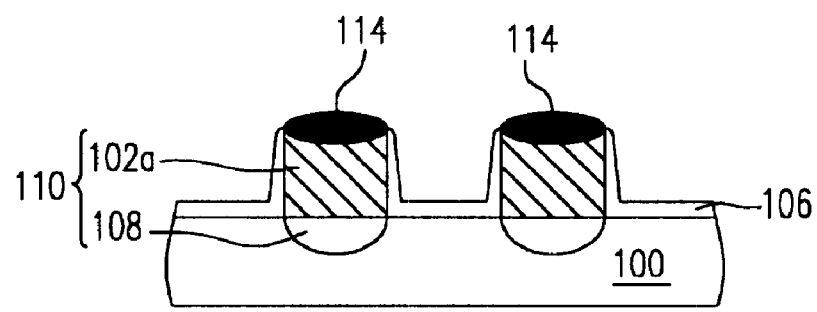

In FIG. 1E, a self-aligned suicide process is performed to form a self-aligned silicide layer 114 on the top surface of the bit line 110. The self-aligned silicide process mainly comprises performing an annealing process to make the metal layer 112 react with the doped polysilicon lines 102a and then removing the unreacted metal. The method for removing unreacted metal includes performing a wet etching process.

Figure 1F:
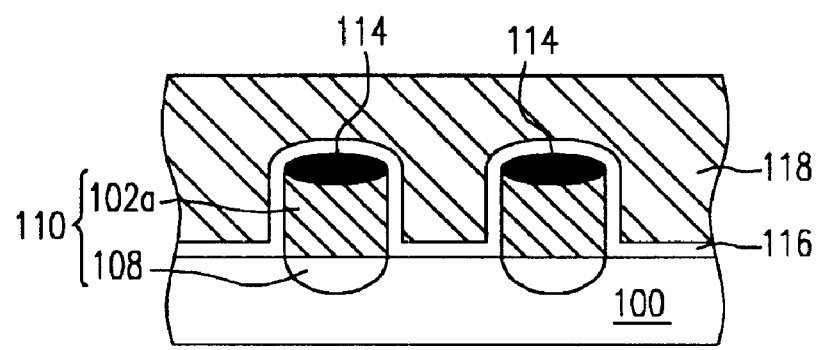

As shown in FIG. 1F, after removing the oxide layer 106, a silicon nitride stacked layer 116 consisting of a stacked structure is formed over the substrate 100. For example, the silicon nitride stacked layer 116 can be a silicon oxide/silicon nitride/silicon oxide (ONO) layer, a silicon oxide/silicon nitride/silicon nitride (ONN) or a nitride/nitride/nitride (NNN) layer. Afterwards, a word line 118 is formed on the silicon nitride stacked layer 116. For instance, the word line 118 can be formed by forming a conductive layer (not shown) over the substrate 100 covering the bit line 110, and defining the conductive layer to form the word line 118. The conductive layer is, for example, a polysilicon layer.

Therefore, the features of the present invention can be concluded as the follows:

1. Because the source/drain region formed under the doped polysilicon lines through the thermal treatment is used as the buried bit line, the present invention can greatly decrease the resistance of the bit line.

2. In the present invention, the source/drain region resulting from dopant diffusion of the doped polysilicon lines into the substrate is an ultra shallow junction. The present invention can avoid short channel effect, since no dopant diffusion of the buried bit line occurs in the thermal process.

3. In addition to the polysilicon lines and the source/drain region, the bit line further includes a self-aligned silicide layer on the top surface of the polysilicon lines, thus increasing conductivity of the bit line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a nitride read only memory (NROM), comprising:

forming a doped polysilicon layer over a substrate, wherein the doped polysilicon layer contains dopants;

forming a patterned mask layer on the doped polysilicon layer;

defining the doped polysilicon layer by using the patterned mask layer as a mask to form a plurality of doped polysilicon lines and expose a portion of the substrate;

performing a thermal process to form an oxide layer on the exposed substrate and sidewalls of the doped polysilicon lines and drive the dopants diffusing into the substrate to form a source/drain region, thereby obtaining a plurality of bit lines including the doped polysilicon lines and the source/drain region;

removing the patterned mask layer to expose a top surface of the bit lines;

performing a self-aligned silicide process to form a self-aligned silicide layer on the top surface of the bit lines;

removing the oxide layer;

forming a silicon nitride stacked layer over the substrate; and forming a plurality of word lines over the substrate.

2. The method of claim 1, wherein performing a self-aligned silicide process comprises:

forming a metal layer over the substrate to cover the bit lines;

performing an annealing process to make the doped polysilicon lines react with the metal layer, so that the self-aligned silicide layer is formed on the top surface of the bit lines; and removing an unreacted metal layer.

3. The method of claim 2, wherein the metal layer includes a cobalt/titanium layer.

4. The method of claim 2, wherein removing the unreacted metal layer includes performing a wet etching process.

5. The method of claim 1, wherein the thermal process comprises a thermal oxidation process.

6. The method of claim 1, wherein the patterned mask layer comprises a silicon nitride layer.

7. The method of claim 1, wherein the word lines comprise polysilicon layers.

8. The method of claim 1, wherein the silicon nitride stacked layer is selected from the following group consisting of a silicon oxide/silicon nitride/silicon oxide layer, a silicon oxide/silicon nitride/silicon nitride (ONN) and a nitride/nitride/nitride (NNN) layer.

9. A method for fabricating a nitride read only memory (NROM), comprising:

providing a substrate;

forming a plurality of conductive lines on the substrate, wherein the conductive lines contain dopants, wherein a mask layer is formed on a top surface of the conductive lines;

performing a thermal process to form an oxide layer on the exposed substrate and sidewalls of the conductive lines and drive the dopants diffusing into the substrate to form a source/drain region;

removing the mask layer to expose the top surface of the conductive lines;

performing a self-aligned silicide process to form a self-aligned silicide layer on the top surface of the conductive lines;

removing the oxide layer;

forming a silicon nitride stacked layer over the substrate to cover the conductive lines and the self-aligned silicide layer; and forming a plurality of word lines over the substrate.

10. The method of claim 9, wherein performing a self-aligned silicide process comprises:

forming a metal layer over the substrate to cover the conductive lines;

performing an annealing process to make the conductive lines react with the metal layer, so that the self-aligned silicide layer is formed on the top surface of the conductive lines; and removing an unreacted metal layer.

11. The method of claim 10, wherein the metal layer includes a cobalt/titanium layer.

12. The method of claim 10, wherein removing the unreacted metal layer includes performing a wet etching process.

13. The method of claim 9, wherein the conductive lines comprise doped polysilicon lines.

14. The method of claim 9, wherein the thermal process comprises a thermal oxidation process.

15. The method of claim 9, wherein the mask layer comprises a silicon nitride layer.

16. The method of claim 9, wherein the silicon nitride stacked layer is selected from the following group consisting of a silicon oxide/silicon nitride/silicon oxide layer, a silicon oxide/silicon nitride/silicon nitride (ONN) and a nitride/nitride/nitride (NNN) layer.

17. The method of claim 9, wherein forming a plurality of word lines comprises:

forming a conductive layer over the substrate to cover the silicon nitride stacked layer; and defining the conductive layer to form the word lines.

18. The method of claim 17, wherein the conductive layer comprises a polysilicon layer.

* * * * *